United States Patent
Hof et al.

(10) Patent No.: US 9,941,906 B2
(45) Date of Patent: Apr. 10, 2018

(54) SLICED POLAR CODES

(71) Applicant: SAMSUNG ELECTRONICS CO., LTD., Suwon-si, Gyeonggi-do (KR)

(72) Inventors: Eran Hof, Ramat Gan (IL); Jun Jin Kong, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/047,196

(22) Filed: Feb. 18, 2016

(65) Prior Publication Data
US 2017/0244429 A1   Aug. 24, 2017

(51) Int. Cl.
*H03M 13/00* (2006.01)
*H03M 13/29* (2006.01)

(52) U.S. Cl.
CPC ... *H03M 13/2924* (2013.01); *H03M 13/6516* (2013.01)

(58) Field of Classification Search
None
See application file for complete search history.

(56) References Cited

U.S. PATENT DOCUMENTS

| | | |
|---|---|---|
| 6,985,097 B2 | 1/2006 | Ueno et al. |
| 8,347,186 B1 * | 1/2013 | Arikan ............ H03M 13/13 714/774 |

(Continued)

FOREIGN PATENT DOCUMENTS

| | | |
|---|---|---|
| KR | 1020120054571 | 5/2012 |
| KR | 1020130001494 | 1/2013 |

OTHER PUBLICATIONS

A. Eslami, et al., "A Practical Approach to Polar Codes," 2011 IEEE International Symposium on Information Theory Proceedings, pp. 1-5.

(Continued)

*Primary Examiner* — Daniel McMahon
(74) *Attorney, Agent, or Firm* — F. Chau & Associates, LLC (57) ABSTRACT

An apparatus for polar coding includes an encoder circuit that implements a transformation $c = u_1^{N-s} B_{N-s} \tilde{M}_n$, where $u_1^{N-s}$, $B_{N-s}$, $\tilde{M}_n$, and C are defined over a Galois field $GF(2^k)$, $k > 1$, $N = 2^k$, $s < N$, $u_1^{N-s} = (u_1, \ldots, u_{N-s})$ is an input vector of N-s symbols over $GF(2^k)$, $B_{N-s}$ is a permutation matrix, $\tilde{M}_n = ((N-s) \text{ rows of } M_n = M_1^{\otimes n})$, the matrix $M_1$ is a pre-defined matrix of size $q \times q$, $2 < q$, $N = q^n$ and $n \geq 1$, and C is a codeword vector of N-s symbols. A decoding complexity of C is proportional to a number of symbols in C. The apparatus further includes a transmitter circuit that transmits codeword C over a transmission channel.

14 Claims, 8 Drawing Sheets

(56) References Cited

U.S. PATENT DOCUMENTS

| | | |
|---|---|---|
| 2013/0283128 A1 | 10/2013 | Lee et al. |
| 2014/0019820 A1 | 1/2014 | Vardy et al. |
| 2014/0040214 A1 | 2/2014 | Ma |
| 2014/0108748 A1 | 4/2014 | Lee et al. |
| 2014/0331083 A1* | 11/2014 | Aliev .................... G06F 11/108 714/6.23 |
| 2015/0295593 A1* | 10/2015 | Trifonov ........... H03M 13/3746 714/776 |
| 2016/0013810 A1* | 1/2016 | Gross .................... H03M 13/09 714/776 |
| 2016/0285479 A1* | 9/2016 | El-Khamy ........ H03M 13/6368 |

OTHER PUBLICATIONS

Yue Li, et al., "A Study of Polar Codes for MLC NAND Flash Memories," pp. 1-5, IEEE ICNC, 2015.
Kai Niu, et al., "Beyond Turbo Codes: Rate-Compatible Punctured Polar Codes," IEEE ICC 2013—Communications Theory, pp. 1-5.
Erdal Arikan, et al., "Channel Polarization, A Method for Constructing Capacity-Achieving Codes for Symmetric Binary-Input Memoryless Channels," IEEE Transactions on Information Theory, vol. 55., No. 7, Jul. 2009, pp. 3051-3073.
Dong-Min Shin, et al., "Design of Length-Compatible Polar Codes Based on the Reduction of Polarizing Matrices, IEEE Transaction on Communications," vol. 6, No. 7, Jul. 2013, pp. 2593-2599.
Kai Niu, et al., "Polar Codes: Primary Concepts and Practical Decoding Algorithms," IEEE Communications Magazine, Jul. 2014, pp. 192-203.

\* cited by examiner

SLICED POLAR CODES

BACKGROUND (a) Technical Field

Embodiments of the present disclosure are directed an error correcting code (ECC) with its accompanied class of decoding algorithms, and more particularly, on a variation of a channel polarization code.

(b) Discussion of the Related Art

Block codes are an important family of ECCs. These codes operate on fixed blocks of information bits. In each encoding operation a vector of k information bits is encoded to a (redundant) vector of N symbols, which in the case of binary codes is N bits. The number of coded bits N is called the block length of the code.

A polar code is a linear block error correcting code developed by Erdal Arikan that is the first code with an explicit construction that achieves the channel capacity for symmetric binary-input, discrete, memoryless channels (B-DMC) under practical complexity. Polar codes are defined as codes of length $N=2^n$, n a positive integer, and there exits algorithms for which the decoding complexity is $O(N \log N)$. For example, for n=10 there is a length 1024 polar code.

Polar codes may be appropriate codes for NAND flash devices, due to their capacity achieving properties. One of the first issues that have to be solved to design polar ECC schemes for NAND flash devices is length compatibility. In various applications of ECC in general, the length of the codes needs to be adjusted to fit a given length. However, in many families of codes, as in the case of channel polarization codes, the block length cannot be chosen arbitrarily and there are many off-the-shelf methods known in the literature to tackle this situation. In many communication and storage systems, such as solid state drives and other NAND Flash memory devices, the number of information bits k is an integral power of two, which makes the block length not an integral power of two. Known method of shortening and puncturing may be applied also for this code, as suggested by various authors in past years. The decoding complexity of an ECC scheme is another important performance characteristic of an ECC system. Off-the-shelf methods for adjusting the block length of a code end up with a decoding complexity that relates to the original block length of the codes, before the adjustments. In many cases, as in the channel polarization codes, the original block length is larger (sometimes, much larger, e.g. approximately doubles) than the target block lengths. This can cause the decoding complexity to be substantially larger than that expected due to the actual transmitted/stored block.

For example, one technique called puncturing involves not transmitting certain bits, and operating the FULL decoder for a full length polar code while fixing no usable information (LLR=0) for the punctured bits. The operations are carried on the complete code graph and therefore the complexity matches that of a full length polar code and not a punctured length polar code. An alternative conventional method is called shortening, which involves operating a full decoder with infinite (maximal level) LLR values. This method allows encoding the information bits in such a way that some of the coded bits are known a-priori (e.g. 0 bits). That is why these bits need not be stored or transmitted in a communication scenario. At the decoder however, the FULL decoder is operated while having perfect information for the shortened bits.

SUMMARY

Exemplary embodiments of the disclosure as described herein generally include systems and methods that provide channel polarization codes of an arbitrary block length while operating at a decoding complexity that relates to the target length.

According to embodiments of the disclosure, there is provided an apparatus for polar coding that includes an encoder circuit that implements a transformation $C = u_1^{N-s} B_{N-s} \tilde{M}_n$, where $u_1^{N-s}$, $B_{N-s}$, $\tilde{M}_n$, and C are defined over a Galois field $GF(2^k)$, $k>1$, where $N=2^n$, $s<N$, $u_1^{N-s} = (u_1, \ldots, u_{N-s})$ is an input vector of N−s symbols over $GF(2^k)$, $B_{N-s}$ is a permutation matrix, $\tilde{M}_n = ((N-s) \text{ rows of } M_n = M_1^{\otimes n})$, the matrix $M_1$ is a pre-defined matrix of size q×q, 2<q and $N=q^n$, and C is a codeword vector of N−s symbols, and where a decoding complexity of C is proportional to a number of symbols in C; and a transmitter circuit that transmits codeword C over a transmission channel.

According to a further embodiment of the disclosure, for a set $F \subset \{1, \ldots, N-s\}$, $u_i = 0 \; \forall i \in F$.

According to a further embodiment of the disclosure, $\tilde{M}_n = (\text{first } (N-s) \text{ rows of } M_n = M_1^{\otimes n})$.

According to a further embodiment of the disclosure, $u_1^{N-s}$, $B_{N-s}$, $M_1$ and corresponding arithmetic operations are defined over the Galois field GF(2).

According to a further embodiment of the disclosure, the permutation matrix $B_{N-s}$ is a bit reversal matrix.

According to a further embodiment of the disclosure, the apparatus includes a receiver circuit that receives an output word $y_1^{N-s}$ from a transmission channel, where $y_1^{N-s}$ is a vector of size N−s defined over a predetermined finite alphabet; and a decoder circuit that generates an estimate of information bits $\hat{u}_1^{N-s}$ of $u_1^{N-s}$ from the output word $y_1^{N-s}$.

According to a further embodiment of the disclosure, $$M_I = \begin{pmatrix} 1 & 0 \\ 1 & 1 \end{pmatrix}.$$

According to embodiments of the disclosure, there is provided an apparatus for polar coding that includes a receiver circuit that receives an output word $y_1^{N-s}$ from a transmission channel, where $y_1^{N-s}$ is a vector of size N−s defined over a predetermined finite alphabet, where output word $y_1^{N-s}$ is related to an input word $u_1^{N-s}$ by $y_1^{N-s} = f(u_1^{N-s} B_{N-s} \tilde{M}_n)$, where $u_1^{N-s}$, $B_{N-s}$, $\tilde{M}_n$, and $y_1^{N-s}$ are defined over a Galois field $GF(2^k)$, $k>1$, where $N=2^n$, $s<N$, $u_1^{N-s} = (u_1, \ldots, u_{N-s})$ is an input vector of N−s bits, $B_{N-s}$ is a permutation matrix, $\tilde{M}_n = ((N-s) \text{ rows of } M_n = M_1^{\otimes n})$, the matrix $M_1$ is a pre-defined matrix of size q×q, 2<q and $N=q^n$, f is a stochastic functional, and a decoder circuit that generates an estimate of information bits of $\hat{u}_1^{N-s}$ of $u_1^{N-s}$ from the output word $y_1^{N-s}$, where a decoding complexity of $y_1^{N-s}$ is proportional to a number of symbols in $y_1^{N-s}$.

According to a further embodiment of the disclosure, for a set $F \subset \{1, \ldots, N-s\}$, $u_i = 0 \; \forall i \in F$.

According to a further embodiment of the disclosure, $\tilde{M}_n = (\text{first } (N-s) \text{ rows of } M_n = M_1^{\otimes n})$.

According to a further embodiment of the disclosure, $u_1^{N-s}$, $B_{N-s}$, $M_1$ and corresponding arithmetic operations are defined over the Galois field GF(2).

According to a further embodiment of the disclosure, the permutation matrix $B_{N-s}$ is a bit reversal matrix.

According to a further embodiment of the disclosure, the apparatus includes an encoder circuit that implements the transformation $c_1^{N-s} = u_1^{N-s} B_{N-s} \tilde{M}_n$; and a transmitter/storage circuit that transmits/store the codeword $c_1^{N-s}$ over the transmission channel/storage media.

According to a further embodiment of the disclosure, $$M_l = \begin{pmatrix} 1 & 0 \\ 1 & 1 \end{pmatrix}.$$

DETAILED DESCRIPTION OF EXEMPLARY EMBODIMENTS

Exemplary embodiments of the invention as described herein generally provide systems and methods that provide channel polarization codes of an arbitrary block length while operating at a decoding complexity that relates to the target length. While embodiments are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

Channel polarization is an operation by which one constructs, from a first set of N independent copies of a B-DMC W, a second set of N binary-input channels $\{W_N^{(i)}: 1 \le i \le N\}$, that show a polarization effect in that, as N becomes large, the fraction of indices i for which the symmetric channel capacity $I(W_N^{(i)})$ is near 1 approaches the channel capacity, denoted by $I(W)$, and the fraction for which $I(W_N^{(i)})$ is near 0 approaches $1-I(W)$. The channel polarization operation includes a channel combining phase and a channel splitting phase. A code constructed on the basis of these principles is known as a polar code. Note that in the following disclosure, all scalars, vectors, matrices and operations over them will be carried out in vector spaces over the binary field GF(2). However, embodiments are not limited to vector spaces over the binary field GF(2), and embodiments of the present disclosure are applicable to vector spaces over any discrete field GF(N) where N is a positive integer. There are generalization to Arikan's original code where the kernel is no longer a 2×2 matrix, and other generalizations where codes are constructed over a non-binary alphabets. A slicing according to embodiments of the disclosure can be carried for all these methods as it relates to the graph. The notation $a_1^N$ refers to a row vector $(a_1, \ldots a_N)$. Polar coding creates a coding system in which one can access each coordinate channel $W_N^{(i)}$ individually and send data only through those for which probability of maximum-likelihood decision error is near 0. In polar coding, $u_1^N$ is encoded into a codeword $x_1^N$ which is sent over the channel $W^N$, and the channel output is $y_1^N$.

Channel combining recursively combines copies of a given B-DMC W to produce a vector channel $W_N: X^N \to Y^N$ where $N=2^n$, n is a positive integer. The encoding of the inputs $u_1^N$ to the synthesized channel $W_N$ into the inputs $x_1^N$ to the underlying raw channel $W^N$ can be expressed as $x_1^N = u_1^N G_N$, where $G_N$ is a generator matrix defined by $$G_N = B_N F_2^{\otimes n}, \qquad (1)$$

for any $N=2^n$, $n \ge 2$, $B_N$ is a bit-reversal matrix, and $F_2^{\otimes n}$ is the $n^{th}$ Kronecker power of $$F_2 = \begin{bmatrix} 1 & 0 \\ 1 & 1 \end{bmatrix},$$

where $\otimes$ represents the Kronecker product of matrices. The transition probabilities of the two channels $W_N$ and $W^N$ are related by $$W_N(y_1^N | u_1^N) = W^N(y_1^N | u_1^N G_N). \qquad (2)$$

For an arbitrary subset A of $\{1, \ldots, N\}$ of size K, EQ. (1) may be rewritten as $$x_1^N = u_A G_N(A) \oplus u_{A^c} G_N(A^c),$$

where $G_N(A)$ represents a submatrix of $G_N$ formed by rows with indices in A. If A and $u_{A^c}$ are fixed, leaving $u_A$ free, a mapping from source blocks $u_A$ to codewords $x_1^N$ is obtained. A is referred to as the information set, and $u_{A^c} \in X^{N-K}$ is referred to as the frozen bits or vector.

Channel splitting splits $W_N$ back into a set of N binary-input coordinate channels $W_N^{(i)}: X \to Y^N \times X^{i-1}$, $1 \le i \le N$, defined by transition probabilities $$W_N^{(i)}(y_1^N, u_1^{i-1} | u_i) = \sum_{u_{i+1}^N \in X^{N-i}} \frac{1}{2^{N-1}} W_N(y_1^N | u_1^N), \qquad (3)$$

where $(y_1^N, u_1^{i-1})$ represents the output of $W_N^{(i)}$ and $u_i$ its input.

Figure 1A:
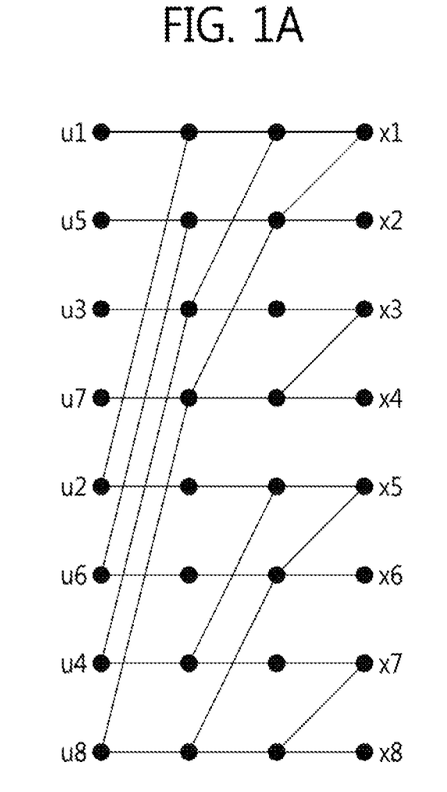
FIGS. 1(a)-(b) illustrate examples of an encoding graph and a decoding graph for polar codes, according to an embodiment of the disclosure.

FIG. 1(a) illustrates an encoder for N=8. The input to the circuit is the bit-reversed version of $u_1^8$, i.e., $\tilde{u}_1^8 = u_1^8 B_8$. Signals flow from left to right. Each edge carries a signal 0 or 1. Each node adds (mod-2) the signals on all incoming edges from the left and sends the result out on all edges to the right. The output is given by $x_1^8 = \tilde{u}_1^8 F^{\otimes 3} = u_1^8 G_8$. In general, the complexity of this implementation is O(N log N) with O(N) for $B_N$ and O(N log N) for $F^{\otimes 3}$.

Figure 1B:
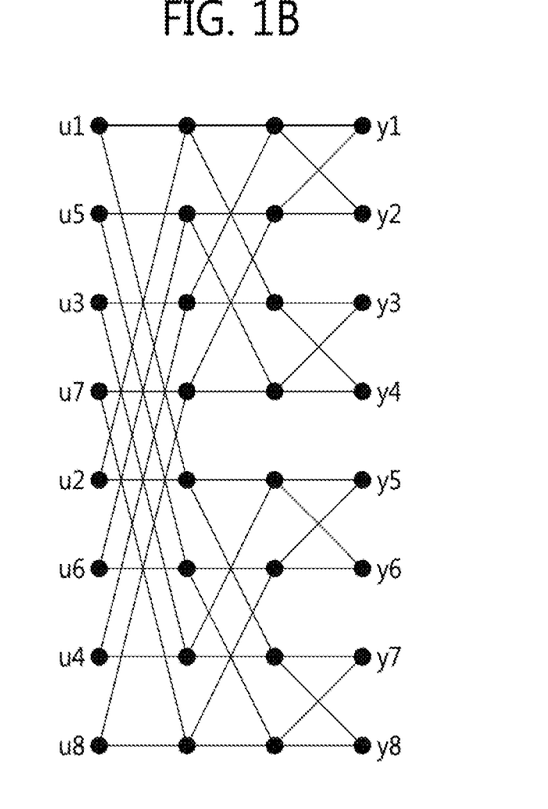

FIG. 1(b) illustrates a decoder for N=8. If the channel output is $y_1^N$, the decoder's job is to generate an estimate $\hat{u}_1^N$ of $u_1^N$ given knowledge of A, $u_{A^c}$, and $y_1^N$. The decoder fixes the frozen part by setting $\hat{u}_{A^c} = u_{A^c}$, which reduces the decoding task to generating an estimate of $\hat{u}_A$ of $u_A$. The decoder includes decision elements (DEs), one for each element $u_i$ of the source vector $u_1^N$, and in general, there is a schedule of node processing over the graph. This is not limited to a specific scheduling, but every decoding algorithm has its own set of possible working schedules, that may depend on the hardware/software resources at hand. Now, based on the schedule, processing of data is flooded within the graph where processing is carried in nodes and data is transferred based on edges. For a node $u_j$, the input would be tentative messages that can be used to generate a ratio of interest.

In an exemplary, non-limiting embodiment of the disclosure as illustrated in FIG. 1(b), the DEs can be activated in the order of 1 to N. If $i \in A^c$, the element is known; so, the ith DE, when its turn comes, simply sets $\hat{u}_i = u_i$ and sends this result to all succeeding DEs. Every intermediate node can be activated as soon as its two left neighbor nodes conclude their processing and as soon as certain previous decisions $u_i$ are available. If $i \in A$, the ith DE waits until it has received the previous decisions $\hat{u}_1^{i-1}$ and as soon as its two left nodes conclude their processing, and upon receiving them, can compute based on previous decisions and tentative intermediate node messages, the likelihood ratio (LR)

$$L_N^{(i)}(y_1^N, \hat{u}_1^{i-1}) \triangleq \frac{W_N^{(i)}(y_1^N, \hat{u}_1^{i-1} \mid 0)}{W_N^{(i)}(y_1^N, \hat{u}_1^{i-1} \mid 1)},$$

and generates its decision as $$\hat{u}_i = \begin{cases} 0, & \text{if } L_N^{(i)}(y_1^N, u_1^{i-1}) \geq 1, \\ 1, & \text{otherwise,} \end{cases}$$

which is then sent to all succeeding DEs. The complexity of this algorithm is determined essentially by the complexity of computing the LRs.

Each node in the graph computes an LR request that arises during the course of the algorithm. Starting from the left side, the first column of nodes correspond to LR requests at length 8 (decision level), the second column of nodes to requests at length 4, the third at length 2, and the fourth at length 1 (channel level). Each node in the graph carries two labels. The first label indicates the LR value to be calculated, and the second label indicates when this node will be activated. It is to be understood that the schedule of node processing as illustrated with regard to FIG. 1(b) is exemplary and non-limiting, and there are other schedules in other embodiments of the disclosure in which the direction of computation is completely different.

Embodiments of the present disclosure are directed to the construction of polar codes of flexible length. The original construction of polar codes produces codes of length $N=2^n$, for $n=1, 2, \ldots$, while practical considerations may obviously require other types of lengths. For example, in NAND flash memories, the code length is determined by the information length, which is typically a power of two, and a small allowed overhead, e.g., 10%, and is typically slightly above a power of two.

For linear codes in general, common methods for building codes of length $N'<N$ from codes of length N are shortening and puncturing. Shortening and puncturing have been also considered for polar codes, but, practical issues have been missed in the literature.

In detail, current state of the art papers use the full factor graph, as if there is no puncturing/shortening, while puncturing/shortening is accounted for by setting input log-likelihood ratios (LLRs) for punctured/shortened bits to $0/\infty$, respectively. The resulting complexity matches the long block length rather than the block length of what is stored, which is a poor performance characteristic.

However, it can be seen that when puncturing/shortening is performed on the certain specific coordinates, the factor graph may by "sliced" such that the number of variable nodes is reduced by a factor that is equal to the ratio between the punctured/shortened length and the original length $N=2^n$. As mentioned above, for NAND flash memories this factor may be close to 2, so that embodiments of the current disclosure can result in about 2× reduction in the number of variable nodes. This implies an even larger reduction in the edge-count and in the overall complexity in comparison to the state of the art in the literature. To conclude, embodiments of the present disclosure will typically decrease complexity by a factor of about 2 in comparison to the existing state of the art. There is also a large gain to be made in term of area of hardware implementation, which would have a considerable effect on hardware costs and power consumption, and memory size for software implementations, although memory size for software is no longer a significant issue.

More formally, according to an embodiment of the disclosure, for $n \geq 1$, define $M_n := M_1^{\otimes n}$, where $$M_1 := \begin{pmatrix} 1 & 0 \\ 1 & 1 \end{pmatrix} \in F_2^{2 \times 2}.$$

A polar code $C \subseteq F_2^N$, with $N=2^n$, has the form $$C = \{uB_n M_n \mid u=(u_1, \ldots, u_N) \in F_2^N, \forall i \in F: u_i = 0\},$$

where $F \subset \{1, \ldots, N\}$ is some set of frozen coordinates.

In detail, according to an embodiment of the disclosure, write $\tilde{M}_n := $(first (N−s) rows of $M_n$), and note that for $z \in F_2^{N-s}$, $$M_n^{-1'}\begin{pmatrix} z \\ 0 \end{pmatrix} = M_n'\begin{pmatrix} z \\ 0 \end{pmatrix} = \tilde{M}_n' z$$

where A' denotes the transpose of A. Since $M_n'$ is upper triangular, the last s rows of $\tilde{M}_n'$ are zero. This means that when z runs over all possible vectors in $F_2^{N-s}$, the first N−s coordinates of $$M_n^{-1'}\begin{pmatrix} z \\ 0 \end{pmatrix}$$

run over all possible vectors in $F_2^{N-s}$, while the last s coordinates must be zero. Therefore, $$M_n^{-1'}C_s = \{(u'_1, \ldots, u'_N) \in F_2^N, \forall i \in B_n F: u'_i = 0 \text{ and } u'_{N-s+1} = u'_{N-s+2} = \ldots = u'_N = 0\}.$$

In other words, shortening the last s coordinates of the code is the same thing as shortening the (not-already-frozen bits among the) last s coordinates of u'. However, it can be observed that since all local codes in the factor graph are either repetition codes of length 2 or single-parity codes, zeroing a variable is exactly the same as deleting its node and all edges connected to this node. Hence, the factor graph may be "sliced" at both the output and the input. In addition, it can also be observed that the slicing need not occur at the last s coordinates of u', but that an arbitrary set of s rows, not necessarily adjacent to each other, may be sliced from anywhere within the polar code. Note that the foregoing description is a particular example of slicing and not a general slicing, which, according to other embodiments of the disclosure, can implemented in terms of any row of the factor graph.

It can be shown that for a proper choice of sliced rows, the decoding performance of sliced polar codes according to embodiments of the disclosure is mathematically equivalent to conventional shortening and puncturing patterns. If the last rows are sliced, the performance can be proven to be identical to shortening the last rows, but with a sliced decoder. If a bit reversed order of rows are sliced, the performance can be proven to be identical to bit-reversed puncturing pattern, but with a sliced decoder. Thus, by a proper choice of the sliced edges and nodes, the resulting coding scheme can operate with the same performance as certain shortening and puncturing techniques. However, a complexity of a sliced code according to an embodiment of the disclosure may match that of the sliced length k(1+OH) and not the original block length $2^n$ where, for the case of storage applications, may be of substantial contribution, as these systems usually operate with high rate codes.

A polar code is sliced from $2^n$ to k(1+OH). A numeric example will better explain the issue. In standard polar coding, all block lengths of codes are integral power of 2, e.g., for n=11 there is a code whose block length is 2048. This includes both information and overhead together. Suppose that the set of good indices is of size 1536, then there is communication with a rate of ¾. This is useful, but in some applications, mainly storage applications, and mainly in NAND flash storage devices, the number of information bits should be an integral power of two, not the entire block length, which includes both information and parity bits together. Suppose that a storage application wishes to communicate with a rate of ¾, in which there is ~33% overhead on top of the information, then the example at hand is challenging as memory devices, and other applications as well, will not work with an information length of 1536—it is either 1024 bits of information or 2048 bits of information. Suppose there is k=1024 bits of information, then the entire block length k(1+OH) is about 1365 bits. However, there are no polar codes of length 1365. It is either 1024 or 2048 for the entire block, information and parity. In another numerical example, suppose a channel operates with 10% overhead, and that k=8192 bits. Then, k(1+OH) is 9011 bits. Again, there is a polar code of length $2^n$=8192 or 16384, so it needs to be sliced.

Now, there is prior art that provides a lengthening solution to this situation. However, the decoder complexity of these prior art solutions, which have no 'slicing', matches the decoder of the 16384 code and not for a 'sliced' code of length 9011. This has a tremendous impact on performance and implementation issues. Both hardware and software decoders will benefit from the complexity reduction, however in hardware there is also a substantial impact on area and power of a decoder implementation if it is a 9011 and not a 16384 length code.

According to an embodiment of the disclosure, the graph is modified by being sliced. That is, given a polar code graph, nodes and corresponding edges are removed from the graph to provide sliced polar codes for the target block length of interest. There are many options to remove nodes and edges. According to an embodiment of the disclosure, at least two of these options, not necessarily the most optimal options, match the error performance of known shortened and punctured techniques. However a decoder according to an embodiment of the disclosure operates on the sliced graph and its decoding complexity therefore matches that of the target length and not the original block length. Note that both the encoder and decoder's graph are sliced, not the input or output of the graph itself. Both encoder and decoder operate/are defined in terms of the code graph, and should normally refer to the same graph.

Shortening and puncturing does not refer to a graph at all, as these operations involve either inserting in some like-information bits that impose zero transmission/storage, and therefore need not to be sent/stored a-priori, or, in the case of puncturing, simply not transmitting certain bits. On the other hand, slicing alters the code itself and therefore the encoding and decoding, while shortening/puncturing simply insert or delete certain bits from transmission. Consequently, schemes based on shortening and puncturing the decoder, and encoder must operate on the entire longer 'mother' code and are therefore more costly in terms of performance and implementation costs. In slicing, the code itself is altered and therefore can operate with simpler machines in terms of time complexity, chip area and power costs.

A polar code graph according to an embodiment of the disclosure is sliced both at the encoder and the decoder. Both decoder and encoder should operate on the same graph, so if a code is sliced, this should be done to both encoder and decoder. Both the encoder and the decoder operate on the shorter sliced code, provided an offline slicing of the graph of the original length N=$2^n$ polar code. The resulting encoder and decoder therefore process a block of size equal to the actual stored/transmitted data and not on an almost double length block of length 2N=2×$2^n$.

This property is useful in most storage systems, in particular solid state storage and in particular NAND flash storage systems, where typical overheads are 8-11% and information block lengths are integral powers of 2. For a 10.94% overhead, 1 KB code, a conventional decoder would have to operate a block of size 16384 bits. A decoder for sliced polar codes according to an embodiment of the disclosure will process a block of 9088 bits. This difference will contribute to improvements in latency, power and area of channel polarization coded schemes.

Slicing of polar codes is defined in terms of the polar code graphs, which are best defined in terms of their encoding (or decoding) graphs. FIGS. 1(a)-(b) illustrate an encoding and a decoding graph, respectively, for polar codes.

Figure 2:
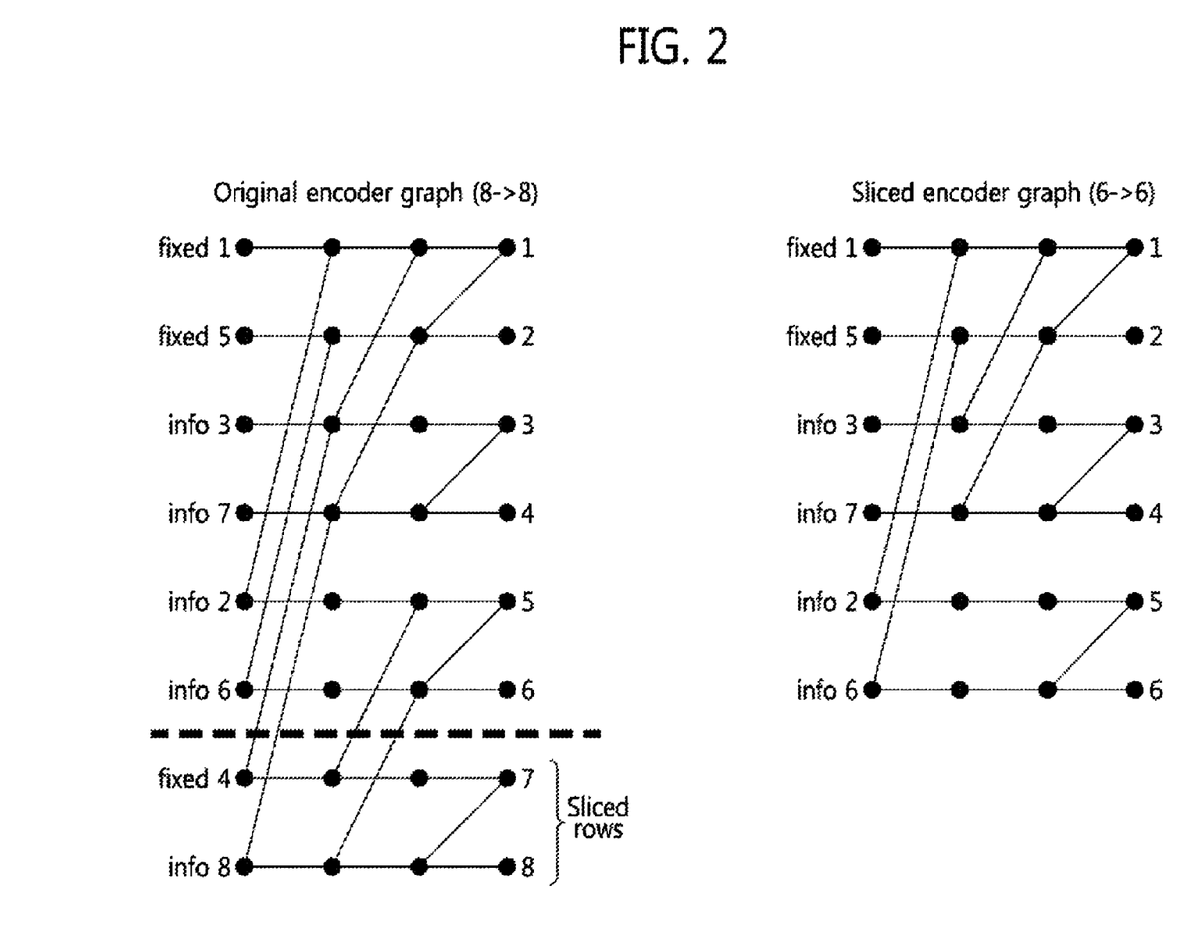
FIG. 2 illustrates slicing of an encoder graph, according to an embodiment of the disclosure.

FIG. 2 illustrates the slicing of an encoder graph. In this graph, graph rows below the dashed horizontal border are removed along with all the edges connecting nodes on these rows to remaining nodes in the graph. At the left hand side, an encoder graph of a length 8 polar code is shown. The two bottom information nodes, below the dashed curve, are to be sliced. The nodes as well as all their corresponding edges are just cut out from the graph. The resulting graph of length 6 is shown on the right hand side of the slide. This is the encoder graph of a sliced polar code. Slicing information nodes 8 and 4 is a non-limiting example. One may slice out nodes in an arbitrary manner. Of course, every slicing pattern has its own effect on the error performance of the resulting code and the actual pattern should be made according to the actual application of the code. Note how the encoding operation relates only to the sliced graph and therefore the complexity matches the sliced code and not the original code.

Figure 3:
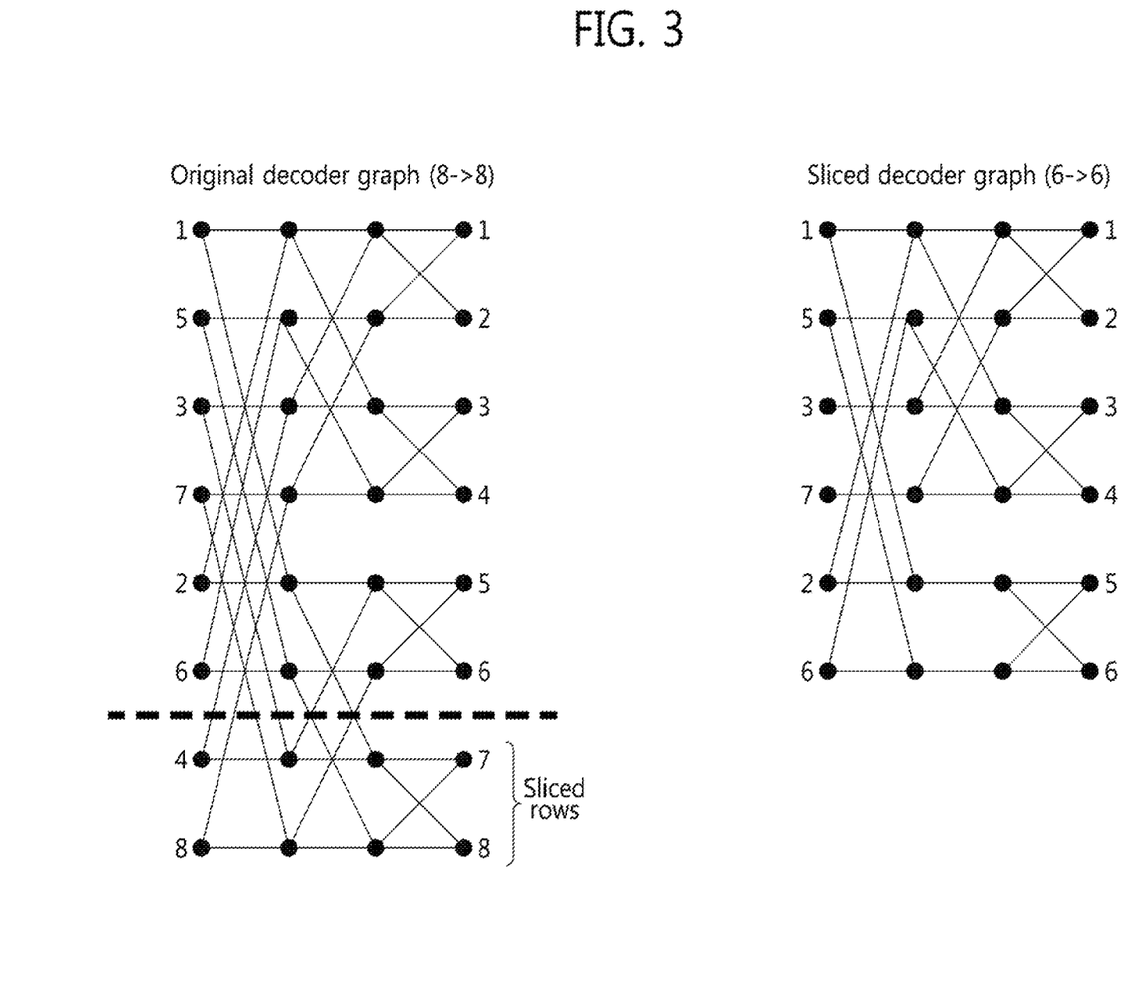
FIG. 3 illustrates slicing of a decoder graph, according to an embodiment of the disclosure.

According to an embodiment of the disclosure, one application of sliced polar codes is in ECC schemes. Here, the codes are sliced polar codes, which are then used for the ECC scheme FIG. 3 illustrates a mirror image of slicing, namely a decoder graph instead of the encoder. The rows below the dashed line on the left side are sliced out along with all the edges connecting nodes within the sliced rows and remaining rows. Node processing at non-altered nodes is kept the same. For altered nodes with a single input, no processing of LLR is performed. Note that decoding of a channel polarization code may use successive cancellation or one of many other cancellation or decoding techniques, such as explicit BP decoding and related simplifications such as MS decoding, and SC list decoding. All of these decoding techniques rely on the graph definition of polar codes and can be applied when the graph is sliced according to an embodiment of the disclosure.

Slicing itself is a simple but novel operation which can solve the lengthening issue in standard polar coding and can provide encoding and decoding with a complexity governed by the target length, k(1+OH), where k is the information length and OH is the overhead, not the full polar length $N=2^n$. Actual node processing is the same for the remaining non-altered nodes. According to embodiments of the disclosure, there is no loss in performance with respect to state-of-the art puncturing and shortening schemes.

According to embodiments of the disclosure, it can be proven that a sliced polar code according to an embodiment of the disclosure can achieve the same error performance as state-of-the-art shortening and puncturing techniques while properly slicing the polar code graphs.

A proof for the slicing proposition may follow by induction: For an N=4 length polar code, the resulting decoding equations can be computed for all possible slicing operations. Assuming the claim follows for $N'=2^{(n-1)}$, it can be verified to satisfy the case for an $N=2^n$ length code.

It can be shown that for a proper choice of sliced rows, the decoding is equivalent to conventional shortening and puncturing patterns. If the last rows are sliced, the performance can be proven to be identical to shortening the last rows, but with a sliced decoder. On the other hand, if bit reversed order of rows are sliced, i.e. bit reverse of 1 . . . #punctured bits, the performance can be proven to be identical to a bit-reversed puncturing pattern, but with a sliced decoder.

Figure 4:
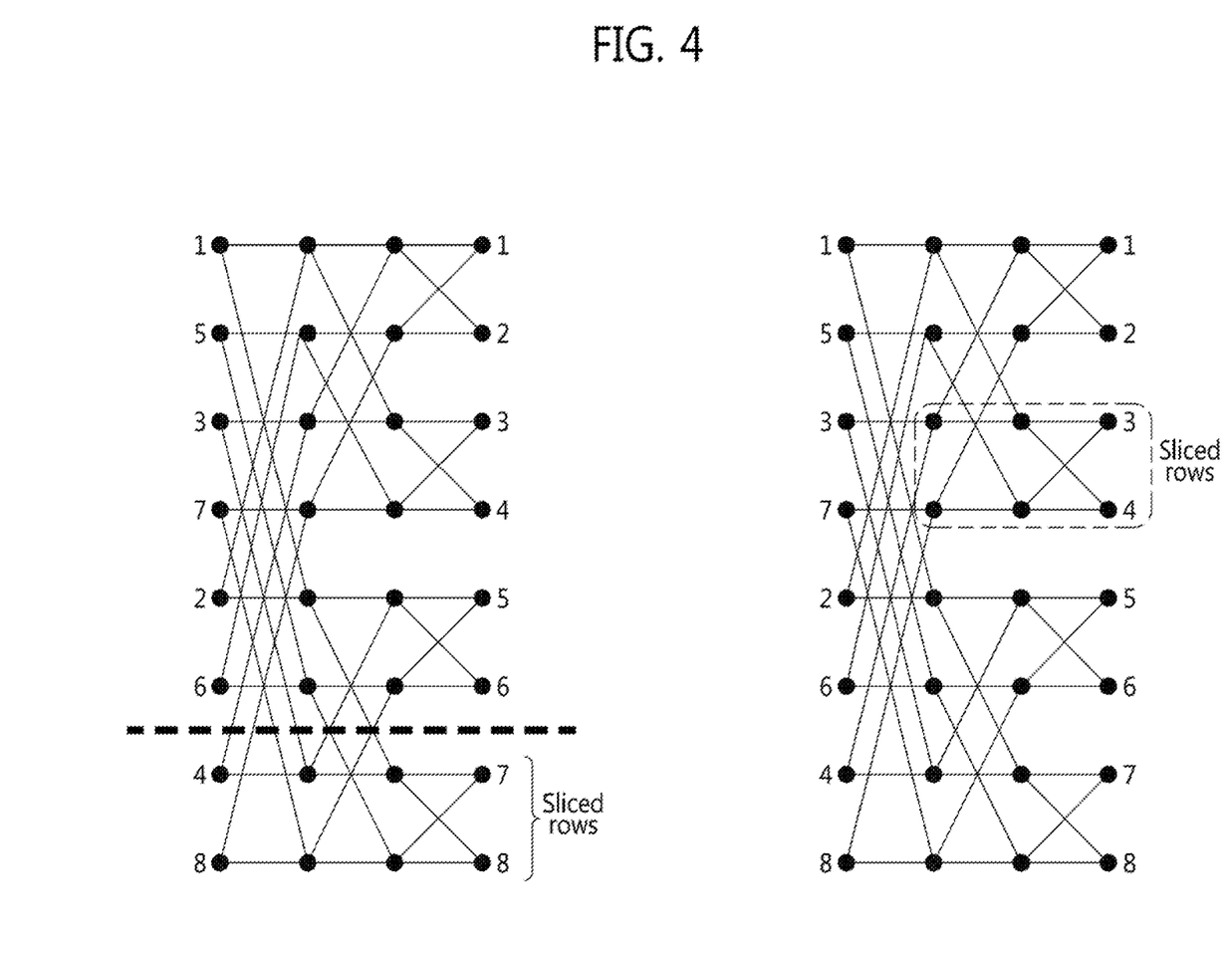
FIG. 4 illustrates another method for slicing in which there are equivalent and almost equivalent slicing locations.
Figure 5:
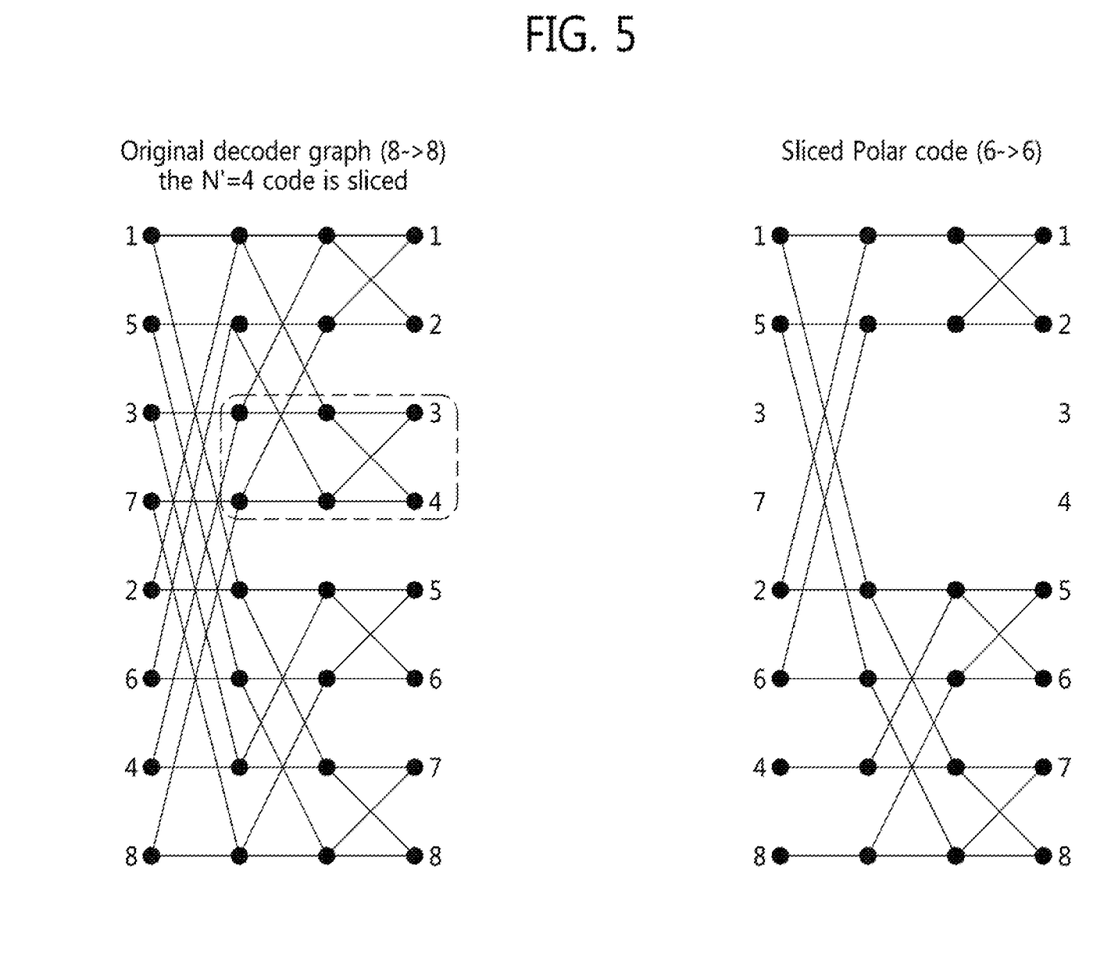
FIG. 5 illustrates the resulting graph, according to an embodiment of the disclosure.
Figure 6:
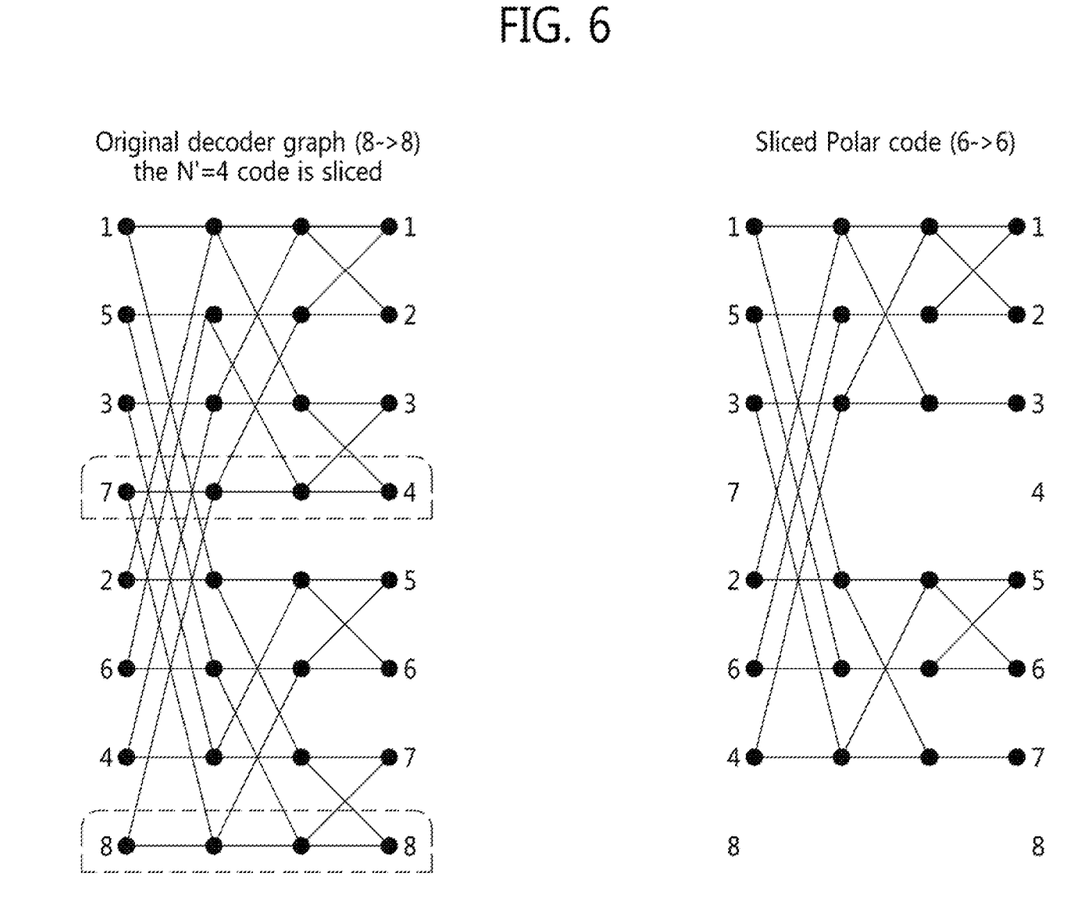
FIG. 6 shows the decoder graph of another slicing, according to an embodiment of the disclosure.

FIG. 4 illustrates another method for slicing in which there are equivalent and almost equivalent slicing locations. This may be of some interest to certain simplified decoding technique where some operations on the graph are less complex than others. Instead of slicing the bottom two rows below the dashed line of an N=8 polar code, as indicated on the left side, one can slice two rows of one of the component N'=4 polar codes, indicated by the dashed circle on the right side and the left side of FIG. 5, and advance a limited polarization for the next level. Note that within the N'=4 polar code this slicing is like the former slicing, while a proper polar step should be carried, leaving only edges that have nodes to be connected to. The resulting 6 node graph is shown in FIG. 5 on the right side. Note that input indices 3 and 7 act almost as 4 and 8, since in a $2^4$ code it is the same, while only the last polarization step is different. FIG. 6 shows the decoder graph of another slicing, in which the N'=4 and N'=8 codes of an 8 node graph is sliced, indicted by the dashed circles on the left side, to produce a 6 node graph on the right side.

Figure 7:
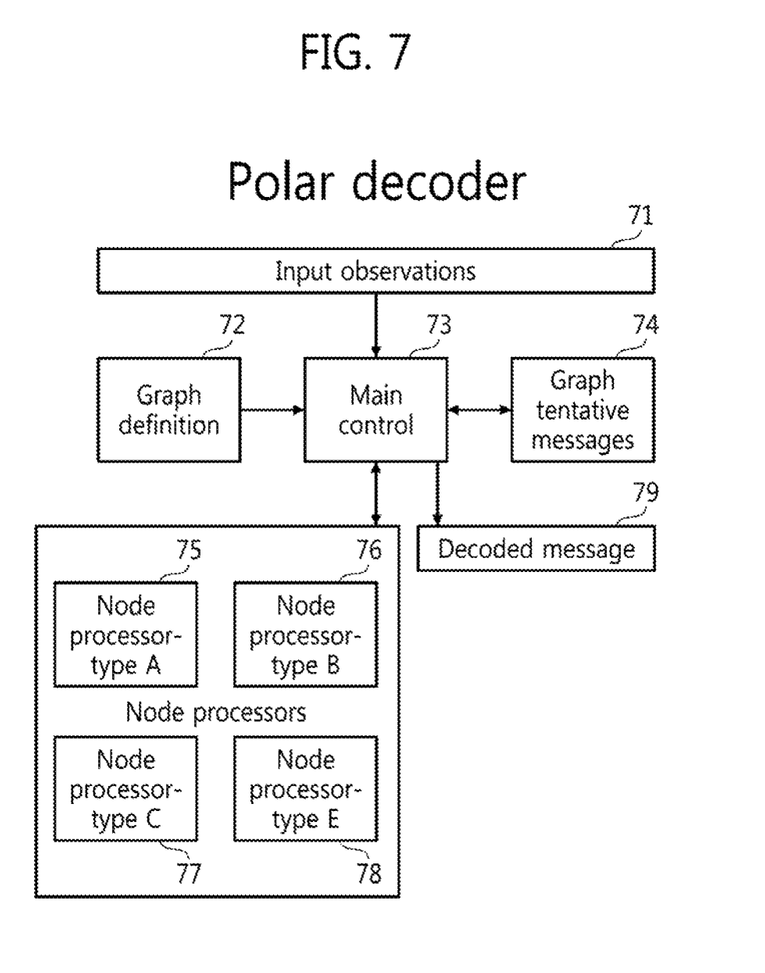
FIG. 7 is a block diagram of a machine for performing sliced encoding/decoding, according to an embodiment of the disclosure.

FIG. 7 is a block diagram of an exemplary apparatus according to an embodiment of the disclosure for a sliced polar decoder. An exemplary apparatus according to an embodiment of the disclosure can be implemented in hardware or software, or any combination of the two. Referring now to the figure, an exemplary apparatus includes an input observations queue 71, a main control unit 73 connected to receive a message from the input observations queue 71, a graph definition memory unit 72 and a tentative message memory unit 74 connected to the main control unit 73, a processor unit 70 of node processors 75, 76, 77, and 78 connected to receive and transmit signals from and to the main control unit 73, and a decoded message queue 79 connected to receive a decoded message from the main control unit 73. Note that the number of node processors in the processor unit 70 is exemplary, and the processor unit 70 may contain an arbitrary number of node processors in other embodiments of the disclosure. If this exemplary apparatus is implemented as hardware, then controller and processors can be application specific integrated circuits (ASICs), field programmable gate arrays (FPGAs), or a general purpose central processing unit (CPU). The graph definition memory unit 73 can store the definition of a sliced graph being processed and the tentative message memory unit 74 can store tentative results, such as LLRs, while messages on the graph are being processed. Both of the units 72, 74 can be, for example, a bank of registers, or a memory unit that is synthesis within the circuit. Based on the graph definition, the main control unit 73 can choose an appropriate input message from the input observations queue 71 for the processor unit 70, which can be chosen according to the specific node type that is being used, and then the main control unit 73 receives the processor output to be stored in the tentative message unit 74. A node processor can be, for example, a summation or a min operation, depending on the actual polar code decoding algorithm that is chosen. When a node corresponding to a $u_i$ value is used, then the main control unit 73 can decide the actual bit message of this $u_i$ node for decoded output. It is to be understood that a slicing according to an embodiment of the disclosure can be applied to any polar decoder, with minimal overhead in implementation complexity.

What is claimed is:

1. An apparatus for polar coding, comprising:
an encoder circuit that implements a transformation $$C = u_1^{N-s} B_{N-s} \tilde{M}_n,$$

wherein $u_1^{N-s}$, $B_{N-s}$, $\tilde{M}_n$, and C are defined over a Galois field $GF(2^k)$, k>1,
wherein $N=2^k$, s<N, $u_1^{N-s}=(u_1, \ldots, u_{N-s})$ is an input vector of N-s symbols over $GF(2^k)$, $B_{N-s}$ is a permutation matrix, $\tilde{M}_n = ((N-s) \text{ rows of } M_n = M_1^{\otimes n})$, the matrix $M_1$ is a pre-defined matrix of size q×q, 2<q, $N=q^n$ and n≥1, and C is a codeword vector of N-s symbols, and
wherein a decoding complexity of C is proportional to a number of symbols in C; and
a transmitter circuit that transmits codeword C over a transmission channel.

2. The apparatus of claim 1, wherein for a set $F \subset \{1, \ldots, N-s\}$, $u_i=0 \ \forall i \in F$.

3. The apparatus of claim 1, wherein $\tilde{M}_n$=(first (N-s) rows of $M_n = M_1^{\otimes n}$).

4. The apparatus of claim 1, wherein $u_1^{N-s}$, $B_{N-s}$, $M_1$ and corresponding arithmetic operations are defined over the Galois field GF(2).

5. The apparatus of claim 1, wherein the permutation matrix $B_{N-s}$ is a bit reversal matrix.

6. The apparatus of claim 1, further comprising:
a receiver circuit that receives an output word $y_1^{N-s}$ from a transmission channel, wherein $y_1^{N-s}$ is a vector of size N-s defined over a predetermined finite alphabet; and
a decoder circuit that generates an estimate of information bits $\hat{u}_1^{N-s}$ of $u_1^{N-s}$ from the output word $y_1^{N-s}$.

7. The apparatus of claim 1, wherein $$M_I = \begin{pmatrix} 1 & 0 \\ 1 & 1 \end{pmatrix}.$$

8. An apparatus for polar coding, comprising:
a receiver circuit that receives an output word $y_1^{N-s}$ from a transmission channel, wherein $y_1^{N-s}$ is a vector of size N-s defined over a predetermined finite alphabet, wherein output word $y_1^{N-s}$ is related to an input word $u_1^{N-s}$ by $y_1^{N-s}=f(u_1^{N-s}B_{N-s}, \tilde{M}_n)$,
wherein $u_1^{N-s}$, $B_{N-s}$, $\tilde{M}_n$, and $y_1^{N-s}$ are defined over a Galois field $GF(2^k)$, k>1,
wherein $N=2^k$, s<N, $u_1^{N-s}=(u_1, \ldots, u_{N-s})$ is an input vector of N-s bits, $B_{N-s}$ is a permutation matrix, $\tilde{M}_n=$ ((N-s) rows of $M_n = M_l^{\otimes n}$), the matrix $M_1$ is a pre-defined matrix of size q×q, 2<q, $N=q^n$ and n≥1, f is a stochastic functional and
a decoder circuit that generates an estimate of information bits $\hat{u}_1^{N-s}$ of $u_1^{N-s}$ from the output word $y_1^{N-s}$, wherein a decoding complexity of $y_1^{N-s}$ is proportional to a number of symbols in $y_1^{N-s}$.

9. The apparatus of claim 8, wherein for a set $F \subset \{1, \ldots, N-s\}$, $u_1=0$ $\forall i \in F$.

10. The apparatus of claim 8, wherein $\tilde{M}_n=$(first (N-s) rows of $M_n = M_l^{\otimes n}$).

11. The apparatus of claim 8, wherein $u_1^{N-s}$, $B_{N-s}$, $M_1$ and corresponding arithmetic operations are defined over the Galois field GF(2).

12. The apparatus of claim 8, wherein the permutation matrix $B_{N-s}$ is a bit reversal matrix.

13. The apparatus of claim 8, further comprising:
an encoder circuit that implements a transformation $$c_1^{N-s} = u_1^{N-s} B_{N-s} \tilde{M}_n; \text{ and}$$

a circuit that transmits the codeword $c_1^{N-s}$ over the transmission channel, or stores the codeword $c_1^{N-s}$ in a storage media.

14. The apparatus of claim 8, wherein $$M_I = \begin{pmatrix} 1 & 0 \\ 1 & 1 \end{pmatrix}.$$

* * * * *